US011257679B2

(12) United States Patent
Loh

(10) Patent No.: US 11,257,679 B2
(45) Date of Patent: Feb. 22, 2022

(54) METHOD FOR REMOVING A SACRIFICIAL LAYER ON SEMICONDUCTOR WAFERS

(71) Applicant: STMICROELECTRONICS PTE LTD, Singapore (SG)

(72) Inventor: Tien Choy Loh, Singapore (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 0 days.

(21) Appl. No.: 16/690,673

(22) Filed: Nov. 21, 2019

(65) Prior Publication Data

US 2020/0168464 A1 May 28, 2020

Related U.S. Application Data

(60) Provisional application No. 62/771,379, filed on Nov. 26, 2018.

(51) Int. Cl.
*H01L 21/3065* (2006.01)
*H01L 21/02* (2006.01)
*H01L 21/67* (2006.01)

(52) U.S. Cl.
CPC .... *H01L 21/3065* (2013.01); *H01L 21/02016* (2013.01); *H01L 21/02019* (2013.01); *H01L 21/02118* (2013.01); *H01L 21/67069* (2013.01); *H01L 21/67086* (2013.01)

(58) Field of Classification Search
None
See application file for complete search history.

(56) References Cited

U.S. PATENT DOCUMENTS

| 4,431,478 | A | | 2/1984 | Yamaoka et al. |
| 5,122,439 | A | * | 6/1992 | Miersch .............. H01L 21/4846 430/311 |
| 7,531,047 | B1 | | 5/2009 | Dryer et al. |
| 8,603,917 | B2 | | 12/2013 | Kwon et al. |
| 8,614,053 | B2 | | 12/2013 | Quillen et al. |
| 8,987,181 | B2 | | 3/2015 | Pollard et al. |
| 9,331,023 | B1 | * | 5/2016 | Liu ..................... H01L 23/3114 |
| 2004/0043603 | A1 | * | 3/2004 | Wood ................ H01L 21/76831 438/637 |

(Continued)

FOREIGN PATENT DOCUMENTS

JP        61232625 A  * 10/1986  ......... H01L 21/3046

OTHER PUBLICATIONS

Myneni, "Post Plasma Etch Residue Removal Using Carbon Dioxide Based Fluids", Dissertation, Dec. 2004, 220 pages.

(Continued)

*Primary Examiner* — Allan W. Olsen
(74) *Attorney, Agent, or Firm* — Seed Intellectual Property Law Group LLP

(57) ABSTRACT

One or more embodiments are directed to methods of removing a sacrificial layer from semiconductor wafers during wafer processing. In at least one embodiment, the sacrificial layer is removed from a wafer during an $O_2$ plasma etch step. In one embodiment, the sacrificial layer is poly(p-phenylene-2, 6-benzobisoxazole) (PBO) or polyimide. The $O_2$ plasma etch step causes a residue to form on the wafer. The residue is removed by immersing the wafer a solution that is a mixture of the tetramethylammonium hydroxide (TMAH) and water.

20 Claims, 3 Drawing Sheets

(56) References Cited

U.S. PATENT DOCUMENTS

| | | | |
|---|---|---|---|
| 2007/0045632 A1* | 3/2007 | Oliver | H01L 23/552 257/79 |
| 2011/0049731 A1* | 3/2011 | Dershem | H01L 21/02118 257/792 |
| 2012/0103087 A1* | 5/2012 | Nakanishi | G01F 1/6842 73/272 R |
| 2015/0364436 A1* | 12/2015 | Yu | H01L 24/14 438/614 |
| 2016/0079087 A1* | 3/2016 | Yeduru | H01L 21/4853 257/773 |
| 2018/0061811 A1* | 3/2018 | Shen | H01L 21/563 |
| 2019/0006194 A1* | 1/2019 | Lin | H01L 25/0657 |
| 2019/0157100 A1* | 5/2019 | Harikai | H01L 21/31144 |

OTHER PUBLICATIONS

Song et al., "Photoresist Removal Using Alternative Chemistries and Pressures", Solid State Phenomena vols. 145-146, 2009, pp. 303-310.

Yota et al., "Integration of Photodefmable Polybenzoxazole as Intermetal Dielectric for GaAs HBT Technology", 2014, 15 pages.

* cited by examiner

METHOD FOR REMOVING A SACRIFICIAL LAYER ON SEMICONDUCTOR WAFERS

BACKGROUND

Technical Field

The present disclosure is related to semiconductor processing, and, in particular, to removing a sacrificial layer on semiconductor wafers during processing.

Description of the Related Art

In simple terms, semiconductor processing involves forming and removing various layers on wafers. Often a sacrificial layer is patterned on a surface of a wafer to protect one or more first layers of material during subsequent processing steps. Once the subsequent processing steps are complete, the sacrificial layer may be removed. When removing the sacrificial layer, it is important that the process for removing the sacrificial layer does not damage any of the layers exposed during the removal process.

For instance, a sacrificial layer is often formed on a front side of a wafer so that a back side of the wafer may be processed. After the front side processing is complete, the sacrificial layer is removed. There is a desire to remove the sacrificial layer without damaging the various components on the front side of the wafer.

BRIEF SUMMARY

One or more embodiments are directed to methods of removing a sacrificial layer from semiconductor wafers during wafer processing. In at least one embodiment, the sacrificial layer is removed from a wafer during an $O_2$ plasma etch step. In one embodiment, the sacrificial layer is poly(p-phenylene-2, 6-benzobisoxazole) (PBO) or polyimide. The $O_2$ plasma etch step causes a residue to form on the wafer. The residue is removed by immersing the wafer a solution that is a mixture of the tetramethylammonium hydroxide (TMAH) and water.

At least one embodiment is directed to a method that includes forming a layer of PBO or polyimide on a first side of a semiconductor wafer. The first side of the semiconductor wafer includes a plurality of dice with active surfaces. The wafer may be flipped over so that a back side of the wafer is processed. For example, the wafer may be thinned, etched, or both.

After back side wafer processing is complete, the layer of PBO or polyimide may then be removed. Removing the layer of PBO or polyimide includes etching the layer in an $O_2$ plasma etch step and immersing the wafer in a wet etch solution. The wet etch solution includes a combination of TMAH and water. The wet etch solution removes any residue or by-products that may form on the wafer during the $O_2$ plasma etch step. That is, during etching of the PBO or polyimide layer in the $O_2$ plasma etch step, a residue forms on the wafer. The residue may include silicon, oxygen, or carbon or any combination thereof. The wet etch solution is able to remove the residue without damaging the integrity of bond pads and passivation layers at the active surface of plurality of dice. Thus, bonds formed between bond pads of the dice on the wafer and conductive elements, such as a conductive wire, during assembly are thereby improved.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

DETAILED DESCRIPTION

It will be appreciated that, although specific embodiments of the present disclosure are described herein for purposes of illustration, various modifications may be made without departing from the spirit and scope of the present disclosure.

In the following description, certain specific details are set forth in order to provide a thorough understanding of various aspects of the disclosed subject matter. However, the disclosed subject matter may be practiced without these specific details. In some instances, well-known structures, such as semiconductor integrated circuit devices, and well-known semiconductor processing techniques disclosed have not been described in detail to avoid obscuring the descriptions of other aspects of the present disclosure.

FIGS. 1A-1F show portions of a semiconductor wafer 10 in cross-section at various stages of manufacturing.

Figure 1A:
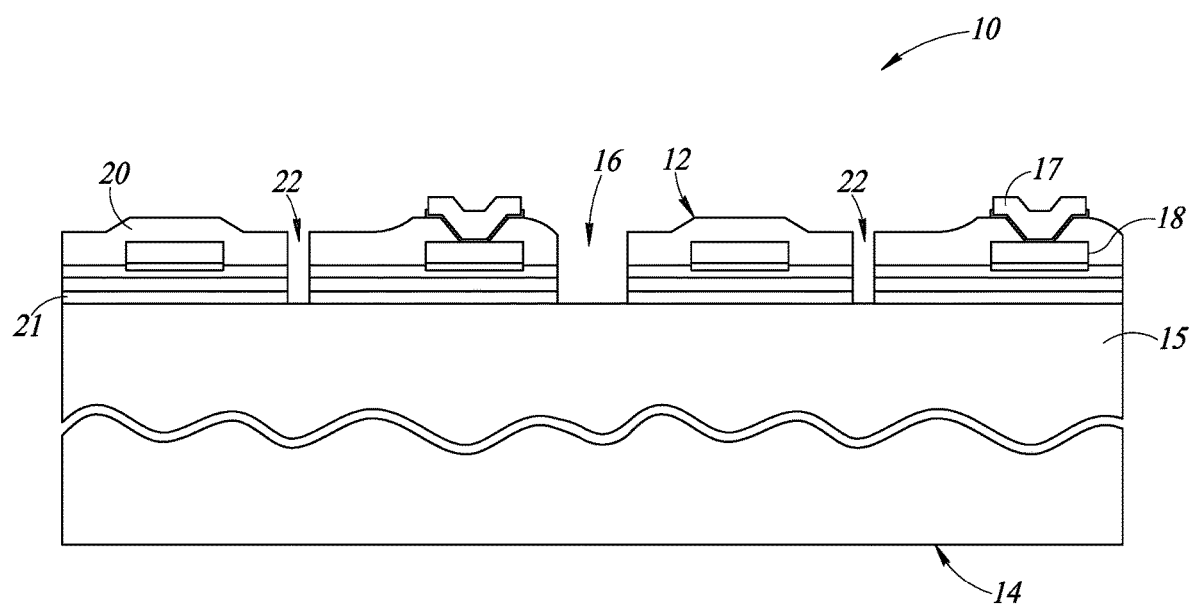
FIGS. 1A-1F are cross-sectional views illustrating various stages of processing of a semiconductor wafer in accordance with one embodiment.

FIG. 1A shows a portion of the semiconductor wafer 10 having a front side 12 and a back side 14. The wafer 10 includes a plurality of semiconductor dice or chips having the active surfaces that include electrical components, such as passive and active components, integrated circuits, membranes, etc., as is well known in the art. The back side 14 of the wafer is formed by a wafer substrate 15, which is any semiconductor material, such as silicon. The wafer substrate 15 shown in the drawing includes a break line to indicate that a thickness of the wafer substrate is substantially thicker than is being shown. In one embodiment, the thickness of the wafer substrate 15 is 525 microns (μm).

The front side 12 of the wafer 10 includes the active surfaces. Portions of two dice coupled together at a dicing or scribe street 16 on the wafer 10 are shown. The semiconductor dice may be microelectromechanical systems (MEMS) devices, such as pressure sensors, gas sensors, etc.

The front side 12 of the wafer 10 includes bond pads 17 coupled to conductive traces 18, which may be coupled to one or more of the electrical components of the active surface. The bond pads 17 may be formed of one or more conductive layers. In one embodiment, the bond pads 17, or at least the uppermost layer of the bond pads, are made of a metal material, such as a noble metal like platinum or gold.

A first dielectric layer 20 is formed over the front side 12 of the wafer 10 to protect various electrical components therebelow. The bond pads 17, which electrically couple the electrical components to external devices, remain exposed from dielectric layer 20 by openings at the bond pads 17. The dielectric layer 20 may be a passivation layer, such as $SiO_2$ or $Si_3N_4$.

A second dielectric layer 21 is formed at a surface of the wafer substrate 15. In at least one embodiment, the second dielectric layer 21 may be any layer that acts as an etch stop for the wafer substrate 15, such as an etch stop for silicon. For instance, the second dielectric layer 21 may be silicon dioxide.

The wafer 10 includes further conductive and dielectric layers as are well known in the art of semiconductor processing; however, the details of which will not be described to avoid obscuring features and aspects of the present disclosure.

Through openings 22 extend through the first and second dielectric layers 20, 21 and any other conductive and dielectric layers therebetween to expose a surface of the wafer substrate 15. As will be explained below, each through opening 22 forms a vent hole for a respective membrane to be formed.

Figure 1B:
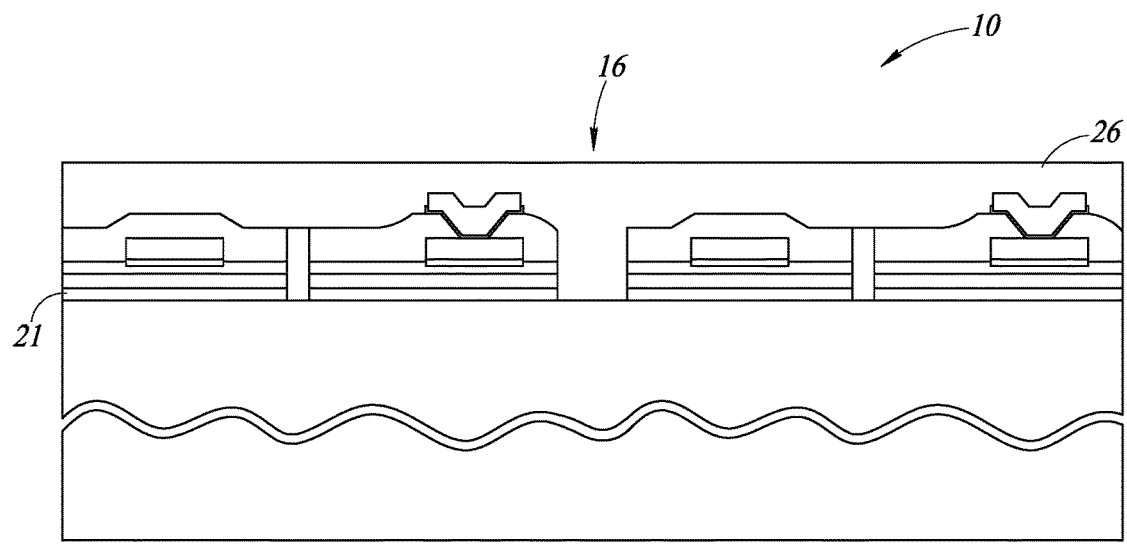

With reference to FIG. 1B, a sacrificial layer 26 is formed over the front side 12 of the wafer 10 to protect the front side, while the back side 14 of the wafer 10 is processed. The sacrificial layer 26 covers the entire front side 12 of the wafer 10, including the dicing street 16. The sacrificial layer 26 is formed by depositing and curing a layer of poly(p-phenylene-2,6-benzobisoxazole) (PBO) or polyimide.

Figure 1C:
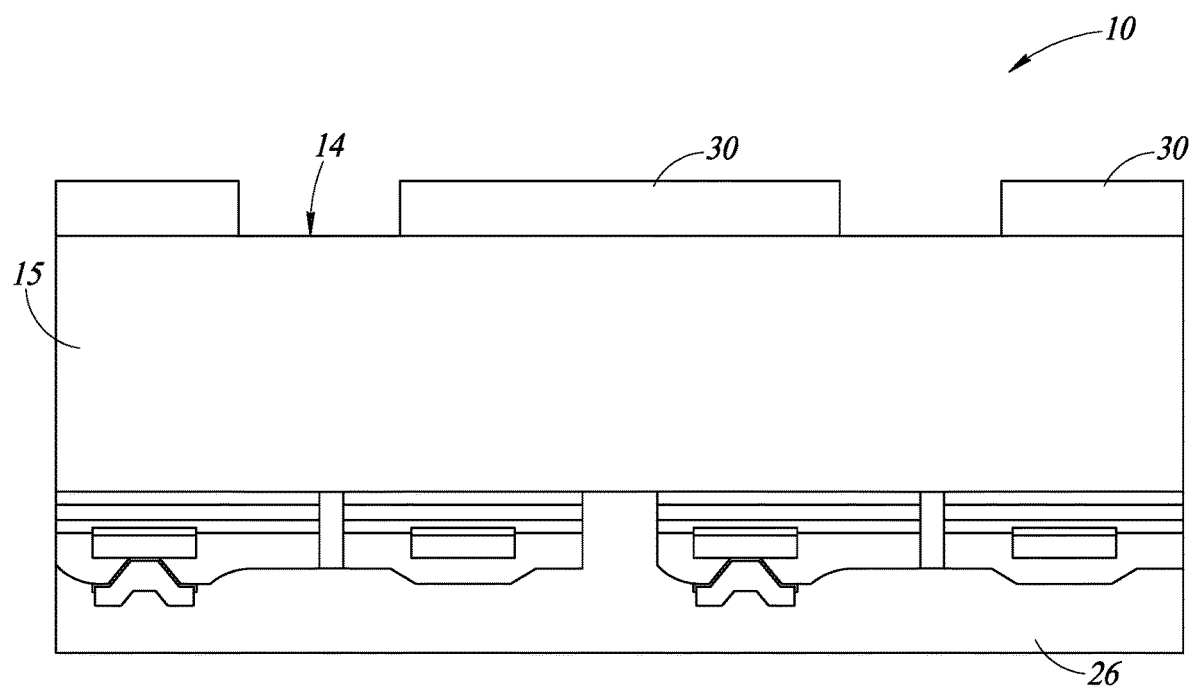

After the sacrificial layer 26 is formed, the back side 14 of the wafer 10 may be processed. The back side 14 of the wafer 10 may be processed in any manner. In one embodiment, the back side 14 of the wafer 10 is first thinned and then patterned for removing particular portions of the wafer 10 at the back side 14. For instance, the back side 14 of the wafer 10 may be thinned by grinding, etching, or a combination thereof to obtain a thickness of between about 100 to 300 microns (μm). In FIG. 1C, the break line has been removed from the wafer substrate 15 to indicate the wafer substrate has been thinned.

When the wafer 10 is of a desired thickness, the back side 14 of the wafer 10 may be patterned for further processing. In particular and with reference to FIG. 1C, a light-sensitive material, such as photoresist, is deposited on the back side 14 of the wafer 10. In particular, portions of the light-sensitive material are patterned to form a mask layer or a patterned layer 30, such that portions of the back side 14 of the wafer 10 are covered with the photoresist, while other portions remain exposed. In particular, portions of the light-sensitive material may be exposed to ultraviolet radiation and then removed by a photoresist developer. In particular and as shown in FIG. 1C, exposed portions of the light-sensitive material are removed to form the patterned layer 30 and expose the back side 14 of the wafer 10. Although a positive photoresist is described, it is to be appreciated that the photoresist may be a negative photoresist. That is, the photoresist that is exposed to ultraviolet radiation becomes insoluble to the photoresist developer.

Figure 1D:
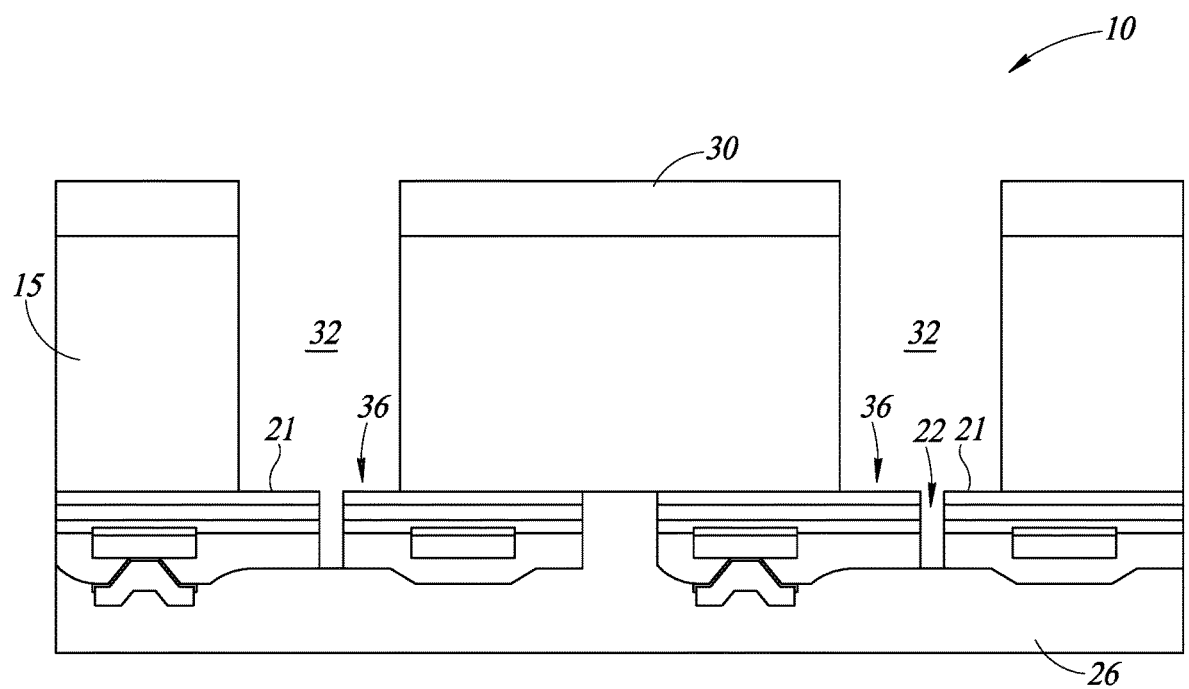

With reference to FIG. 1D, the back side 14 of the wafer 10 is removed at the portions at which the wafer substrate 15 remains exposed from the photoresist to thereby forming trenches 32 in the dice of the wafer 10. In one embodiment, the wafer substrate 15 is etched in a dry etch step as is well known in the art. The second dielectric layer 21 at the front side 12 of the wafer acts an etch stop for the semiconductor material of the wafer substrate 15. As previously mentioned, in one embodiment, the second dielectric layer 21 is silicon dioxide, which acts as the etch stop for a silicon wafer substrate. The sacrificial layer 26 may also act as an etch stop at the through openings 22, or may be partially etched at the through openings 22.

By forming the trenches 32 of the wafer material, membranes 36 are suspended at the front side 12 of the wafer 10. The membranes 36 are part of a microelectromechanical sensor (MEMS) structure. In one embodiment, the membrane 36 has a thickness that is less than 10 μm, while the wafer substrate 15 is 100 microns (μm) or more. In another embodiment, the thickness of the wafer substrate 15 is 300 μm. The through opening 22 forms a vent hole for the membrane 36. The through opening 22 allows both sides of the membrane 36 to be in fluid communication with each other to release air due to changes in temperature or pressure as is well known in the art. The sacrificial layer 26 protects the front side 12 of the wafer 10 during processing of the back side 14 of the wafer 10.

Figure 1E:
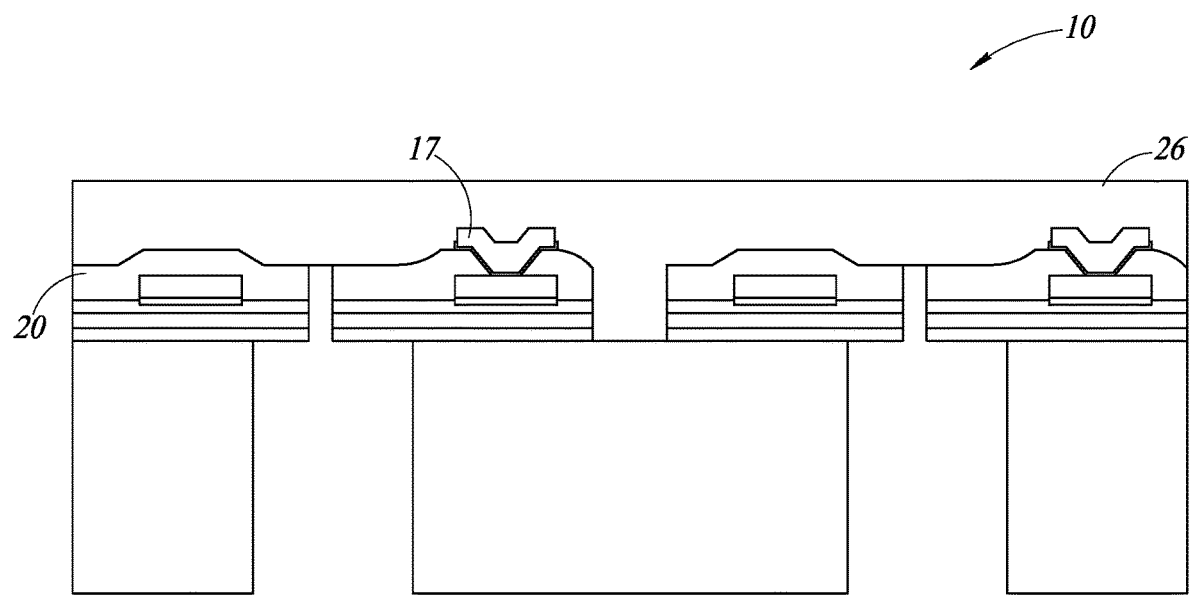

After back side processing of the wafer 10 is complete, the sacrificial layer 26 may be removed. FIG. 1E shows the wafer 10 flipped back over so that the front side 12 of the wafer 10 is facing up to indicate the wafer is ready for front side processing. As previously mentioned, it is desirable to remove the sacrificial layer 26 without causing damage to conductive and dielectric layers therebelow. In particular, it is desirable to remove all of the sacrificial layer 26 without causing damage to the first dielectric layer 20 that protects various components of the dice on the wafers 10, as well as protecting the bond pads 17. More particularly, it is also desirable to remove any residue formed while removing the sacrificial layer 26, while at the same time preserving the integrity of the first dielectric layer 20 and the bond pads 17.

The sacrificial layer 26 is removed in a two-step process. In a first step, the sacrificial layer 26 is removed in a dry etch step, and in particular, in an $O_2$ plasma etch step. In a second step, the wafer 10 is processed in a wet etch solution to remove any residue that forms on the front side 12 of the wafer 10 during the dry etch processing step. The wet etch solution is a combination of tetramethylammonium hydroxide (TMAH) and $H_2O$ (water). In one embodiment, the wet etch solution is 4%-6% TMAH, with the remaining portion being water. The wet etch step may involve immersing the wafer 10 in a bath of the wet etch solution at a temperature of about 75° C. for between 30 seconds to 2 minutes. The wet etch step may also include agitation. The second step may further include a gentle deionized water (DIW) rinse, spin and dry such that the spin does not cause cracking/breaking the membranes of the MEMS structures.

It is to be appreciated that the inventor discovered that using an $O_2$ plasma step alone fails to remove the sacrificial layer, and resulted in a residue being formed on the bond pads of the front side of the wafer. It was discovered that this residue was the cause of poor bonding between conductive elements, such as conductive wires, that were coupled to the bond pads. Thus, the performances of the dice were affected due to the poor electrical connection with conductive elements.

In accordance with the two-step process, the sacrificial layer 26 is removed without leaving any residues or by-products behind. Furthermore, the wet etch solution does not react with the uppermost layer of the bond pad, such as a noble metal like platinum or gold, as well as the passivation layer on the wafer, to cause damage that affecting the reliability of the dice. In that regard, coupling structures to the bond pads that occurs during semiconductor packaging, such as during wire bonding, flip chip bonding or other couplings to bond pads, is improved. Thus, the electrical performances of the dice have improved.

Furthermore, the inventor discovered that the residue caused by the $O_2$ plasma step included silicon, oxygen, and carbon. Thus, it is believed that the layer of PBO or polyimide includes some type of silicon-containing fillers that cannot be removed by conventional $O_2$ plasma etch techniques.

Table 1 provided below shows the results of a first spectrum analysis of a bond pad made of platinum (Pt). The first spectrum analysis was taken at three separate locations on the bond prior to the second processing step for removing the sacrificial layer. That is, the spectrum analysis of the bond pad occurred after the first step of removing the sacrificial layer but before the wet etch step in the solution of TMAH and water. Thus, the spectrum analysis is performed after the $O_2$ plasma etch but before the wet etch step.

TABLE 1

Spectrum Analysis of Bond Pad Prior to Solution Processing Step

| Spectrum Label | Spectrum 1 | Spectrum 2 | Spectrum 3 |
|---|---|---|---|
| C | 2.82 | 3.22 | 2.94 |
| O | 6.14 | 5.29 | 5.82 |
| Si | 3.36 | 3.81 | 2.86 |
| Pt | 87.68 | 87.67 | 88.38 |
| Total | 100 | 100 | 100 |

As shown in the chart, silicon (Si), oxygen (O), and carbon (C) are present on the surface of the bond pad in small quantities. Platinum (Pt), which is the material of the bond pad, is present in the greatest quantity.

Table 2 provided below shows the results of a second spectrum analysis of the same bond pad after the second step of removing the sacrificial layer. That is, the spectrum analysis is performed at approximately the same three locations of the bond pad but after the wafer had been exposed to the wet etch solution

TABLE 2

Spectrum Analysis of Bond Pad Post Solution Processing Step

| Spectrum Label | Spectrum 1 | Spectrum 2 | Spectrum 3 |
|---|---|---|---|
| C | 1.34 | 1.81 | 2.36 |
| O | 2.20 | 2.62 | 2.41 |
| Pt | 96.46 | 95.58 | 95.23 |
| Total | 100 | 100 | 100 |

As shown in Table 2, silicon (Si) is no longer detected on the bond pad, the amount of oxygen (O) has been significantly reduced, and the amount of carbon (C) has been notably reduced. Therefore, the percentage of platinum (Pt) that is detected on the bond pad has increased accordingly.

Figure 1F:
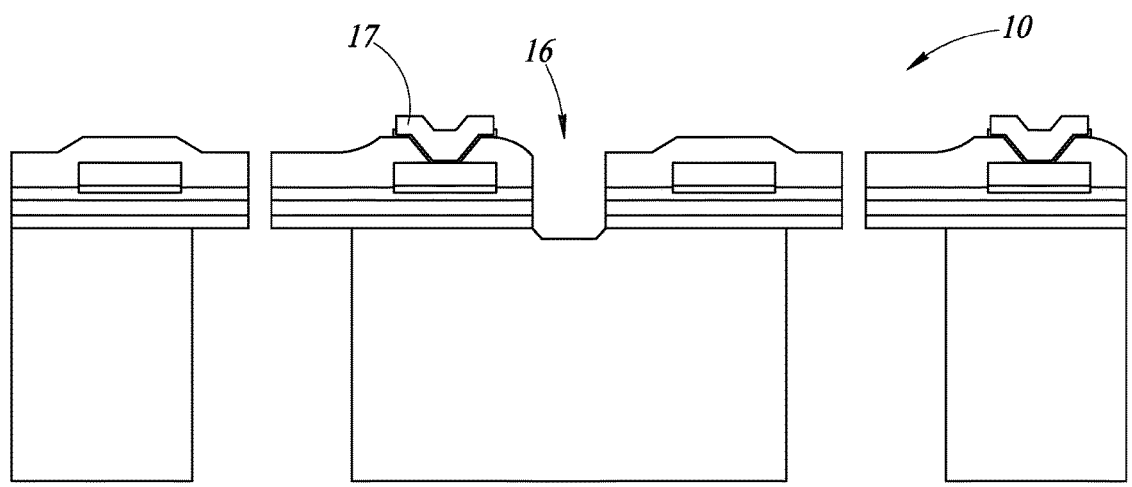

In embodiments in which the wafer substrate is a silicon wafer substrate, the silicon wafer substrate may also be etched during the two-step process for removing the sacrificial layer 26. With reference to FIG. 1F, the silicon substrate is etched at the dicing or scribe street 16. That is, upon removing the sacrificial layer 26 at the dicing street, the silicon wafer substrate is exposed to the wet etch solution. The wet etch solution etches the silicon substrate at the dicing street.

Furthermore, the inventor also discovered that the wet etch solution improves the overall defectivity level of the front side of the wafer. In particular, the visual inspection of the wafers improved, thereby improving visual inspection wafer yield.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   forming a layer of PBO or polyimide on a first side of a semiconductor wafer, the first side of the semiconductor wafer including a plurality of dice with active surfaces, each die of the plurality of dice including a plurality of conductive bond pads on the active surfaces;
   processing a back side of the semiconductor wafer; and
   removing the layer of PBO or polyimide, wherein removing includes:
      etching the layer of PBO or polyimide in an $O_2$ plasma etch step, wherein the etching leaves residue on the plurality of conductive bond pads, wherein the residue consists of silicon, oxygen, or carbon or any combination thereof; and
      immersing the wafer in a solution that includes TMAH and water, wherein the solution removes the residue on the plurality of conductive bond pads.

2. The method of claim 1, wherein processing the back side of the semiconductor wafer includes etching through the wafer to form membranes.

3. The method of claim 1, wherein the solution is 4%-6% TMAH and a remaining portion of the solution being $H_2O$.

4. The method of claim 1, wherein the wafer is immersed in the solution for about 30 seconds to 1 minute.

5. The method of claim 1, wherein the solution is maintained at a temperature of about 75° C. while the wafer is immersed therein.

6. The method of claim 1, further comprising rinsing the wafer in deionized water after immersing the wafer in the solution.

7. The method of claim 1, further comprising dicing the wafer to form individual semiconductor dice.

8. A method, comprising:
   forming a layer of PBO or polyimide on a first side of a semiconductor wafer, the first side of the semiconductor wafer including a plurality of dice with active surfaces;
   processing a back side of the semiconductor wafer;
   in an $O_{o2}$ plasma etch step, removing the layer of PBO or polyimide and forming a residue on at least a portion of the first side of the wafer, wherein the residue consists of silicon, oxygen, or carbon or any combination thereof; and
   immersing the wafer in a solution to remove the residue, the solution being a combination of TMAH and water.

9. The method of claim 8, wherein the residue consists of silicon, oxygen, and carbon.

10. The method of claim 8, wherein the wafer is immersed in the solution for about 30 seconds to 1 minute.

11. The method of claim 8, wherein the solution is 4%-6% TMAH and a remaining portion of the solution is $H_2O$.

12. The method of claim 8, wherein the residue is formed on bond pads of the plurality of dice.

13. The method of claim 12, wherein the bond pads include one or more layers that are made of a noble metal.

14. The method of claim 8, wherein forming the layer of PBO or polyimide includes depositing the PBO or polyimide and curing the deposited PBO or polyimide.

15. A method, comprising:
   forming a layer of PBO or polyimide on a first side of a semiconductor wafer, the first side of the semiconductor wafer including a plurality of dice with active surfaces and bond pads at the active surfaces;
   processing a back side of the semiconductor wafer;
   in an $O_2$ plasma etch step, removing the layer of PBO or polyimide, while removing the layer of PBO or polyimide a residue forms on the first side of the wafer, wherein the residue consists of silicon, oxygen, or carbon or any combination thereof; and
   removing at least some of the residue by immersing the wafer in a solution that includes TMAH and water.

16. The method of claim 15, wherein the solution is 4%-6% TMAH and a remaining portion of the solution is $H_2O$.

17. The method of claim 15, wherein the solution is maintained at a temperature of about 75° C. and the wafer is immersed in the solution between 30 seconds and 1 minute.

18. The method of claim 15, wherein the residue consists of silicon, oxygen, and carbon.

19. The method of claim 15, wherein the first side of the semiconductor wafer has a passivation layer.

20. The method of claim 19, wherein the bond pads have an outer surface made of platinum or gold.

\* \* \* \* \*

UNITED STATES PATENT AND TRADEMARK OFFICE
CERTIFICATE OF CORRECTION

PATENT NO. : 11,257,679 B2
APPLICATION NO. : 16/690673
DATED : February 22, 2022
INVENTOR(S) : Tien Choy Loh Page 1 of 1

It is certified that error appears in the above-identified patent and that said Letters Patent is hereby corrected as shown below:

In the Claims

Column 6, Claim 8, Line 51:
"an $O_{o2}$ plasma" should read: -- an $O_2$ plasma --.

Signed and Sealed this
Twenty-fourth Day of May, 2022

Katherine Kelly Vidal
*Director of the United States Patent and Trademark Office*